United States Patent [19]

Ogitani et al.

[11] Patent Number: 5,158,989
[45] Date of Patent: Oct. 27, 1992

[54] ELECTROLESS PLATING-RESISTING INK COMPOSITION

[75] Inventors: Osamu Ogitani; Toru Shirose, both of Koshigaya, Japan

[73] Assignee: Somar Corporation, Japan

[21] Appl. No.: 593,947

[22] Filed: Oct. 9, 1990

[30] Foreign Application Priority Data

Nov. 18, 1989 [JP] Japan .................................. 1-300549

[51] Int. Cl.$^5$ .......................... C08K 3/36; C08K 5/54; C08K 9/06; C08L 63/02
[52] U.S. Cl. ........................................ 522/77; 522/83; 522/166; 522/170; 523/443; 523/466
[58] Field of Search ................... 522/77, 83, 166, 170; 523/443, 466, 200, 205, 427, 428

[56] References Cited

U.S. PATENT DOCUMENTS

| | | | |
|---|---|---|---|
| 4,251,576 | 2/1981 | Osborn et al. | 524/787 |
| 4,394,434 | 7/1983 | Rohloff | 430/270 |
| 4,622,349 | 11/1986 | Koleske et al. | 522/77 |
| 4,684,671 | 8/1987 | Tsuchiya et al. | 522/170 |
| 4,732,961 | 3/1988 | Oka | 523/466 |

FOREIGN PATENT DOCUMENTS

| | | | |
|---|---|---|---|
| 0071345 | 2/1983 | European Pat. Off. | 523/427 |
| 6454442 | 10/1986 | Japan . | |
| 62-273221 | 11/1987 | Japan | 523/427 |
| 2177093 | 1/1987 | United Kingdom . | |

OTHER PUBLICATIONS

Patent Abstracts of Japan, vol. 13, No. 379 (c–288) Aug. 22, 1989.
Patent Abstracts of Japan, vol. 13, No. 261 (P-885) Jun. 16, 1989.
Patent Abstracts of Japan, vol. 9, No. 153(C-288) Jun. 27, 1985.

*Primary Examiner*—John C. Bleutge
*Assistant Examiner*—Christopher P. Rogers
*Attorney, Agent, or Firm*—Lorusso & Loud

[57] ABSTRACT

A photocurable ink composition for forming patterns resistive to electroless plating is disclosed which includes (a) an epoxy resin, (b) an aliphatic polyol polyglycidyl ether as a reactive, viscosity controlling agent, (c) a photopolymerization catalyst, and (d) hydrophobic silica particles as a thixotropic agent.

9 Claims, No Drawings

ELECTROLESS PLATING-RESISTING INK COMPOSITION

This invention relates to a photocurable ink composition and, more specifically, to a photocurable, platingresist ink composition suitable for forming a pattern resistive to electroless plating in the fabrication of printed wiring boards.

For the fabrication of a printed wiring board having wiring patterns on both sides thereof and through holes with conductive layers on their inside surfaces, there has been widely adopted so called subtracting method in which the inside surface of each through hole is first subjected to electroless plating for the formation of the conductive layer on the inside wall thereof and, then, the both sides of the board are subjected to electroplating and etching.

Recently, in response to an increasing demand for high density printed wiring boards, an "additive method" has been developed, in which method electroless plating is used for forming conducting layers on inside walls of the through holes and wiring patterns on both sides of the board. Ink compositions to be used for forming resist patterns in such an additive method should satisfy the following conditions:

(1) The viscosity of the ink should not change with time. This is necessary to ensure stable printability. A change of the viscosity requires corresponding change of printing conditions.

(2) The ink should afford, after screen printing and curing, fine patterns with good resolution and good reproducibility in order to prevent the occurrence of short circuit and the breakage of wiring patterns and to ensure formation of high density patterns.

(3) The ink should be hardened within a short period of time at a low temperature in order to prevent the warp or dimensional change of boards.

(4) The ink should afford hardened ink patterns having high resistance to chemicals, i.e. resistance both to a surface roughening liquid and to an electroless plating liquid. Poor resistance to the roughening liquid will cause deposition of copper dots on the resist ink patterns (so called "copper spots"). Poor resistance to the electroless plating liquid will cause dissolution of ink components into the electroless plating liquid, which in turn results in the reduction of elongation of copper wiring patterns formed by the electroless plating.

As an electroless plating resist ink, there are known a number of thermosetting epoxy resin compositions. With such epoxy resin compositions, the resolution of ink patterns is not satisfactory since ink patterns unavoidably experience the lowering of viscosity before completion of thermal hardening. Additionally, the thermosetting epoxy resin compositions have a drawback because it takes a long time to complete the thermal hardening of the ink patterns.

To cope with these problems, there has been proposed a photopolymerization-type, electroless plating resist ink. This ink involves photo-radical polymerization type and photocationic polymerization type compositions. The ink composition of the former type generally contains a monomer or an oligomer of an acrylic or methacrylic ester (Japanese Tokkyo Kokai No. 60-121,443). With such a radical polymerization-type ink composition, however, the ester group tends to undergo hydrolysis upon contact with an electroless plating liquid and the unreacted monomer tends to be dissolved in the plating liquid during the electroless plating stage. As a result, the plating liquid is fouled to cause deterioration of copper wiring patterns formed by the electroless plating.

The resist ink composition of the latter type uses a photo-cationic polymerization catalyst. One such known ink is disclosed in Japanese Tokkyo Kokai No. 64-54442 and includes:

(A) an epoxy resin having at least two glycidyl ether groups each bonded direct to an aromatic nucleus;

(B) a diluent which is an oxyrane ring-containing compound such as phenyl glycidyl ether;

(C) a photopolymerization initiator which is an aromatic onium salt such as hexafluoroantimonic acid triphenylsulfonium;

(D) an alcohol having 2–4 hydroxyl groups such as ethylene glycol; and (E) talc powder. The above resist ink composition has been found to involve a problem because the talc powder inhibits the photopolymerization so that the resist patterns do not have sufficient hardness. Another problem is that the alcohol makes the resist patterns less resistive to chemicals so that "copper sprinkle" and fouling of plating liquids are caused.

The present invention has been made to solve the problems of the prior art resist ink compositions and is aimed at the provision of a photo-cationic polymerization type ink composition which satisfies the above conditions (1) through (4).

In accordance with the present invention there is provided a photocurable ink composition comprising the following ingredients (a) through (d):

(a) an epoxy resin having at least two glycidyl ether groups each bonded direct to an aromatic nucleus;

(b) an aliphatic polyol polyglycidyl ether;

(c) a photopolymerization catalyst; and (d) hydrophobic silica particles, wherein the weight ratio of ingredient (a) to ingredient (b) is in the range of 90:10 to 40:60 and the amounts of ingredients (c) and (d) are 0.1–10 % and 0.5–15 %, respectively, based on the total weight of ingredients (a) and (b).

The preferred embodiments of the present invention will now be described in detail below.

INGREDIENT (A)

The epoxy resin of Ingredient (a) is excellent in photohardenability and affords a highly cross-linked, strong, cured pattern. Because of the absence of ester groups in its molecule, Ingredient (a) gives cured ink patterns having excellent resistance to chemicals.

Examples of epoxy resins to be used in the present invention include bisphenol epoxy resins such as bisphenol A epoxy resins, bisphenol F epoxy resins and bisphenol AD epoxy resins; phenol novolak epoxy resins; cresol novolak epoxy resins; and mixtures thereof. These epoxy resins may be obtained by reacting a bisphenol, a phenol novolak resin or a cresol novolak resin with epichlorohydrin in the presence of an alkali catalyst and may be commercially available under the following names:

EPIKOTE 807, 825, 828, 834, 1001, 1004, 152, 157 and 180 (manufactured by Yuka-Shell Epoxy Inc.);

D.E.R. 331, 337, 661 and 664; D.E.N. 431 and 432 (manufactured by Dow Chemical, Japan);

EPOTOTE YDF-170, YDF-2001, YD-128, YD-134, YD-011, YD-014, YDPN-638 and YDCN-701 (manufactured by Toto Kasei K. K.).

R-710 (manufactured by Mitsui Sekiyu Kagaku Kogyo K. K.)

The epoxy resin preferably has an epoxy equivalent of 120-5,000.

INGREDIENT (B)

Ingredient (b) serves to control the viscosity of the composition and to impart flexibility to the cured ink pattern. Because of the absence of ester groups in its molecule, Ingredient (b) does not adversely affect the resistance to chemicals of the cured ink pattern.

Aliphatic polyol polyglycidyl ethers to be used in the present invention may be obtained by reaction of a polyol with epichlorohydrin in the presence of an alkali catalyst and preferably have a weight epoxy equivalent of 80-400. Examples of the polyglycidyl ethers include ethylene glycol diglycidyl ether, polyethylene glycol diglycidyl ether, propylene glycol diglycidyl ether, polypropylene glycol diglycidyl ether, neopentyl glycol diglycidyl ether, 1,4-butanediol diglycidyl ether, 1,6-hexanediol diglycidyl ether, glycerol polyglycidyl ether, polyglycerol polyglycidyl ether, trimethylolpropane triglycidyl ether, sorbitol polyglycidyl ether, halogenated products thereof and mixtures thereof. These glycidyl ethers are commercially available under, for example, the following names:

EPIOL E-100, NPG-100, TMP-100 and G-100 (manufactured by Nihon Yushi K. K.);

ADEKAGLYCIROL ED-503, ED-505 and ED-507; (manufactured by Asahi Denka Kogyo K. K.);

EPOLITE 40E, 200E, 400E, 70P, 400P, 1500 NP, 1600, 80MF, 100MF and FP-1500 (manufactured by Kyoeisha Yushi Kagaku Kogyo K. K.).

INGREDIENT (C)

The photo-cationic polymerization catalyst serves as an initiator for the photo-cationic polymerization of ingredients (a) and (b). Examples of the catalysts are as follows:

(c-1) Diaryliodonium salts:

diphenyliodonium hexafluoroantimonate, diphenyliodonium hexafluorophosphate, 4-chlorophenyliodonium tetrafluoroborate, di(4-methoxyphenyl)iodonium chloride, (4-methoxyphenyl)phenyliodonium, etc;

(c-2) Triarylsulfonium salts:

triphenylsulfonium tetrafluoroborate, triphenylsulfonium hexafluorophosphate, p-(phenylthio)phenyldiphenylsulfonium hexafluoroantimonate, triphenylsulfonium hexafluoroantimonate, 4-chlorophenyldiphenylsulfonium hexafluorophsphate, etc.; (c-3) Triarylselenium salts:

triphenylselenium hexafluorophosphate, triphenylselenium hexafluoroantimonate, etc.;

(c-4) Others:

(2,4-cyclopentadiene-1-yl)[(1-methoxyethyl)-benzene]-ironhexafluorophosphate, diphenylsulfonium hexafluoroantimonate, dialkylphenylsulfonium hexafluoroantimonate, dialkylphenylsulfonium hexafluorophosphate, 4,4'-bis[di($\beta$-hydroxyethoxy)phenylsulfonio]phenylsulfide-bishexafluoroantimonate, 4,4'-bis[di(8-hydroxyethoxy)] phenylsulfide-bis-hexafluorophosphate, etc.

The photopolymerization catalyst may be used in the form of a solution in a solvent such as acetonitrile or propylenecarbonate.

INGREDIENT (D)

Hydrophobic silica powder serves to impart thixotropy to the ink composition and to improve reproducibility of printed patterns. Ingredient (d) may be obtained by treating (inclusive of both by reaction and by coating) finely divided silica with an organosilane such as octyltrimethoxysilane or an organosiloxane such as polydimethylsiloxane to render the surface of each of the silica particles hydrophobic. Hydrophobic silica particles may be commercially available as AEROSIL R-202, R-805 and R-812 (manufactured by Nihon Aerosil Inc.) and Cab-O-Sil TS-720 (manufactured by Cabot Inc.). The hydrophobic silica preferably has a particle size in the range of 0.004-0.04 $\mu$m.

The ink composition of the present invention may further contain, if desired, one or more additives such as an epoxy group-containing reactive diluent, a coloring agent, a filler, a defoaming agent, a leveling agent and a solvent.

Illustrative of suitable reactive diluents are phenyl glycidyl ether, methyl phenyl glycidyl ether, n-butyl glycidyl ether, epoxycyclohexylmethyl epoxycyclohexanecarboxylate.

The coloring agents may be, for example, organic pigments such as phthalocyanine green and phthalocyanine blue, inorganic pigments such as titanium oxide, carbon black, lead orcher and ultramarine and various dyes. The filler may be, for example, silica, alumina, aluminum hydroxide, calcium carbonate and clay. The defoaming agent may be, for example, silicone oil. The leveling agent may be, for example, a fluorine-containing surfactant and acrylic copolymers. As the solvent, there may be used ketones, esters, cellosolves and aromatic solvents.

In the resist ink composition of the present invention, the weight ratio of ingredient (a) to ingredient (b) is generally in the range of 90:10 to 40:60, preferably 85-15 to 50:50. The amount of ingredient (c) is generally 0.1-10 %, preferably 0.5-5 % based on a total weight of ingredients (a) and (b). The amount of ingredient (d) is generally 0.5-15 %, preferably 1-10 % based on a total weight of ingredients (a) and (b).

When the weight ratio of (a)/(b) is greater than 90:10, the resulting ink becomes too high in viscosity to smoothly effect printing. Additionally, such an ink gives a hardened pattern which is poor in adhesion and is brittle in nature, so that the patterns are apt to be separated from the board and to be cracked. When the weight ratio of (a)/(b) is smaller than 40:60, on the other hand, the resistance to chemicals of the hardened ink patterns becomes poor. An amount of ingredient (c) below 0.1 % is disadvantageous, because the hardening rate of the ink becomes slow. An amount of ingredient (c) above 10 % does not give any additional advantage but, rather, will cause fouling of the electroless plating liquid. An amount of ingredient (d) below 0.5 % fails to impart sufficient thixotropy to the ink composition so that reproducibility of fine ink patterns becomes insufficient. Too large an amount of ingredient (d) is, on the other hand, disadvantageous because air bubbles are apt to form during screen printing, thereby to cause the formation of "copper sprinkle".

In use, the ink composition of the present invention is applied by screen printing to an adhesive layer of a board. The ink pattern is then hardened by irradiation of actinic radiation such as UV rays. If desired, the photocured pattern may be further thermally treated at 100°-170° C. for 2-30 minutes to improve the pattern characteristics, especially the adhesion to the board. The hardened pattern-bearing board is then immersed in an acidic, roughening liquid to roughen the adhesive layer to which a copper layer is to be formed. The resulting board is next immersed in a strongly alkaline, electroless plating liquid to form a copper wiring pattern on the surface of the board where the resist pattern does not exist.

The following examples will further illustrate the present invention. In the following descriptions, "part" is by weight.

EXAMPLES 1-3 AND COMPARATIVE EXAMPLES 1-7

Resist ink composition containing (a) an epoxy resin, (b) a viscosity controller, (c) 4 parts of a 50% solution of 4,4'-bis[di($\beta$-hydroxyethoxy)pehnylsulfonio]phenylsulfide-bis-hexafluoroantimonate as a photo-cationic polymerization catalyst, (d) a thixotropic agent, (e) 1 (one) part of a silicone defoaming agent (KS-603, manufacturered by Shin-Etsu Silicone Inc.) and (f) 1 (one) part of phthalocyaninie green as a coloring agent were prepared. The kinds and amounts of ingredients (a), (b) and (d) used were as shown in Table 1 below. In Table 1, the abbreviations are as follows:

| EPIKOTE 828: | Bisphenol A epoxy resin, manufactured by Yuka-Shell Epoxy Inc. |
|---|---|
| EPIKOTE 1004: | Bisphenol A epoxy resin, manufactured by Yuka-Shell Epoxy Inc. |
| EPIKOTE 154: | Phenol novolak epoxy resin, manufactured by Yuka-Shell Epoxy Inc. |
| EOCN 103: | Cresol novolak epoxy resin, manufactured by Nippon Kayaku K.K. |
| EPOLITE 100MF: | Trimethylolpropane triglycidyl ether, manufactured by Kyoeisha Yushi Kagaku Kogyo K.K. |
| ADECAGLY-CIROL: | 1,6-hexanediol diglycidyl ether, (ED-503) manufactured by Asahi Denka Kogyo K.K. |
| AEROSIL R-202: | Silica powder treated with polydiethylsiloxane, manufactured by Nihon Aerosil Inc. |
| AEROSIL #300: | Non-treated silica powder, manufactured by Nihon Aerosil Inc. |
| LMP 100: | Talc, manufactured by Fuji Talc Kogyo K.K. |

Each of the resist inks was subjected to the following tests and the results are summarized in Table 1.

(1) STABILITY OF RESIST INK

The sample is measured for its initial viscosity at 25° C. by means of a rotary viscsimeter B8R (manufacturered by Tokyo Keiki Inc.) using a No. 6 rotor (revolution speed: 50 r.p.m.). The sample is charged in a brown, synthetic resin bottle and is allowed to stand at 40° C. for 30 days. Then, the viscosity is measured in the same manner as above.

(2) PATTERN REPRODUCIBILITY

The sample is printed on a paper-phenol resin board (ACL-141, manufactured by Hitachi Kasei Kogyo K. K.) using a 300 mesh polyester screen with a pattern adapted to form a printed pattern having a line width of 100 $\mu$m and an inter-line space of 100 $\mu$m. The board is then passed beneath three, high pressure mercury lamps (80 W/cm) at a conveyor speed of 3 m per minute for exposure of the printed pattern to UV light, thereby hardening the pattern. The line width is then measured to determine the maximum value.

(3) HARDNESS

The sample is coated on a paper-phenol resin board by screen printing using a 300 mesh polyester screen without a pattern and hardened in the same manner as in the above Pattern Reproducibility Test (2). The pencil hardness of the hardened pattern is measured in accordance with Japanese Industrial Standards JIS D 0202.

(4) ADHESION

The hardened pattern obtained in the above Hardness Test (3) is two-dimensionally incised with a knife to form 100 checkers each having a size of 1 mm $\times$ 1 mm. An adhesive tape is then bonded to the cut pattern on the board and is peeled off. The number of the checkers remaining unremoved from the board is counted.

(5) RESISTANCE TO CHEMICALS

The board obtained in the above Pattern Reproducibility Test (2) and bearing the hardened ink pattern is subjected to a roughening treatment and then to an electroless plating as follows:

| (I) Roughening Treatment | |
|---|---|
| Roughening Treatment Bath | |
| Chromium trioxide: | 30 g/liter |
| Concentrated sulfuric acid: | 300 ml/liter |
| Sodium fluoride: | 30 g/liter |
| Roughening Condition | |
| Bath temperature: | 40° C. |
| Immersion time: | 15 minutes |
| Stirring: | by aeration |
| (II) Electroless Plating | |
| Plating Bath | |
| Copper sulfate: | 8 g/liter |
| EDTA: | 30 g/liter |
| 37% Formalin: | 3 ml/liter |
| Polyethylene glycol: | 15 ml/liter |
| 2,2'-Pyridyl: | 20 ml/liter |
| Sodium hydroxide: | to adjust pH to 12.8 at 25° C. |
| Water: | to adjust the volume of bath to 1 liter |
| Plating Condition | |
| Bath temperature: | 70° C. |
| Immersion time: | 20 hours |
| Stirring: | by aeration |

The plated board is washed with water and is checked whether or not any copper spots if formed on the ink pattern.

TABLE 1

| Example | 1 | 2 | 3 | | | | | | | |
|---|---|---|---|---|---|---|---|---|---|---|
| Comptv. Example | | | | 1 | 2 | 3 | 4 | 5 | 6 | 7 |
| Composition | | | | | | | | | | |
| Ingredient (a) | | | | | | | | | | |
| EPIKOTE 828 | 40 | 50 | | 40 | 40 | 40 | 40 | 100 | | 40 |
| EPIKOTE 1004 | | | | | | | | | 35 | |
| EPIKOTE 154 | 40 | | 75 | 40 | 40 | 40 | 40 | | | 40 |

TABLE 1-continued

| Example | 1 | 2 | 3 | | | | | | | |
|---|---|---|---|---|---|---|---|---|---|---|
| Comptv. Example | | | | 1 | 2 | 3 | 4 | 5 | 6 | 7 |
| EOCN 103 | | 25 | | | | | | | | |
| Ingredient (b) | | | | | | | | | | |
| EPOLITE 100MF | 20 | 25 | | 20 | 20 | 20 | 20 | | 65 | 20 |
| ADECAGLYCIROL | | | 25 | | | | | | | |
| Ingredient (d) | | | | | | | | | | |
| AEROSIL R-202 | 4 | 4 | 3 | | | | | 3.5 | 3 | |
| AEROSIL #300 | | | | 4 | | | | | | |
| LMP 100 | | | | | 20 | 4 | 4 | | | 20 |
| Glycerine | | | | | | | 0.5 | | | 0.5 |
| Test Results | | | | | | | | | | |
| Viscosity (Poise) | | | | | | | | | | |
| Initial | 360 | 320 | 360 | 330 | 340 | 170 | 170 | 320 | 390 | 340 |
| After 30 days | 350 | 330 | 360 | 400 | 370 | 180 | 190 | 330 | 400 | 380 |
| Reproducibility (μm) | 110 | 110 | 110 | 110 | 120 | 140 | 140 | 110 | 110 | 120 |
| Hardness | 4H | 4H | 5H | 4H | 2H | 4H | 4H | 4H | 3H | 2H |
| Adhesion | 100 | 100 | 100 | 100 | 100 | 100 | 100 | 0 | 100 | 100 |
| Cu Spots | none | none | none | none | formed | none | formed | none | formed | formed |

What is claimed is:

1. A photocurable ink composition consisting essentially of the following ingredients (a) through (d):
   (a) an epoxy resin having at least two glycidyl ether groups each bonded directly to an aromatic nucleus;
   (b) an aliphatic polyol polyglycidyl ether;
   (c) a photopolymerization catalyst; and
   (d) hydrophobic silica particles, wherein the weight ratio of ingredient (a) to ingredient (b) is in the range of 90:10 to 40:60 and the amounts of ingredients 10 (c) and (d) are 0.1-10 % and 0.5-15 %, respectively, based on the total weight of ingredients (a) and (b).

2. A photocurable ink composition according to claim 1, wherein said epoxy resin is a member selected from the group consisting of bisphenol A epoxy resins, bisphenol F epoxy resins, bisphenol AD epoxy resins, phenol novolak epoxy resins, cresol novolak epoxy resins and mixtures thereof.

3. A photocurable ink composition according to claim 1, wherein said epoxy resin has an epoxy equivalent of 120-5,000.

4. A photocurable ink composition according to claim 1, wherein said aliphatic polyol polyglycidyl ether has an epoxy equivalent of 80-400.

5. A photocurable ink composition according to claim 1, wherein said aliphatic polyol polyglycidyl ether is a member selected from the group consisting of ethylene glycol diglycidyl ether, polyethylene glycol diglycidyl ether, propylene glycol diglycidyl ether, polypropylene glycol diglycidyl ether, neopentyl glycol diglycidyl ether, 1,4-butanediol diglycidyl ether, 1,6-hexanediol diglycidyl ether, glycerol polyglycidyl ether, polyglycerol polyglycidyl ether, trimethylolpropane triglycidyl ether, sorbitol polyglycidyl ether, halogenated products thereof and mixtures thereof.

6. A photocurable ink composition according to claim 1, wherein said hydrophobic silica is a particulate silica, the surface of the silica particles being coated with an organosiloxane or an organosilane.

7. A photocurable ink composition according to claim 1, wherein said hydrophobic silica has a particle size of in the range of 0.004-0.04 μm.

8. A photocurable ink composition according to claim 1, further comprising a reactive diluent selected from the group consisting of phenyl glycidyl ether, methyl phenyl glycidyl ether, n-butyl glycidyl ether, epoxycyclohexylmethyl epoxycyclohexane-carboxylate.

9. A photocurable ink composition according to claim 1, wherein the weight ratio of ingredient (a) to ingredient (b) is in the range of 85:15 to 50:50 and the amounts of ingredients (c) and (d) are 0.5-5 % and 1-10 %, respectively, based on the total weight of ingredients (a) and (b).

* * * * *

UNITED STATES PATENT AND TRADEMARK OFFICE
CERTIFICATE OF CORRECTION

PATENT NO. : 5,158,989

DATED : Oct. 27, 1992

INVENTOR(S) : OGITANI et al.

It is certified that error appears in the above-identified patent and that said Letters Patent is hereby corrected as shown below:

Col. 5, line 18, delete "pehnyl" and insert --phenyl--;

line 23, delete "phthalocyaninie" and insert --phthalocyanine--.

Col. 7, line 32, delete "10", first instance.

Signed and Sealed this

Twenty-first Day of December, 1993

Attest:

BRUCE LEHMAN

Attesting Officer     Commissioner of Patents and Trademarks